(12) United States Patent
Hirakoso et al.

(10) Patent No.: US 7,956,103 B2
(45) Date of Patent: Jun. 7, 2011

(54) INK COMPOSITION AND METALLIC MATERIAL

(75) Inventors: Hideyuki Hirakoso, Yokohama (JP); Keisuke Abe, Yokohama (JP); Yasuhiro Sanada, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 634 days.

(21) Appl. No.: 11/871,446

(22) Filed: Oct. 12, 2007

(65) Prior Publication Data

US 2008/0260995 A1   Oct. 23, 2008

Related U.S. Application Data

(63) Continuation of application No. PCT/JP2006/305271, filed on Mar. 16, 2006.

(30) Foreign Application Priority Data

Apr. 12, 2005   (JP) ................. 2005-114700

(51) Int. Cl.
   *C09D 11/00*   (2006.01)
(52) U.S. Cl. ...... 523/160; 523/161; 106/1.13; 106/1.14; 106/1.23
(58) Field of Classification Search .................. 523/160, 523/161
   See application file for complete search history.

(56) References Cited

U.S. PATENT DOCUMENTS

| | | | |
|---|---|---|---|
| 3,719,610 | A | 3/1973 | Prentice |
| 4,485,153 | A * | 11/1984 | Janikowski et al. .......... 428/688 |
| 6,303,881 | B1 | 10/2001 | Parker, Jr. et al. |
| 2001/0041271 | A1 * | 11/2001 | Watanabe et al. ....... 428/694 SG |
| 2003/0110978 | A1 * | 6/2003 | Abe et al. .................... 106/31.13 |
| 2003/0116057 | A1 | 6/2003 | Suzuki et al. |
| 2005/0285084 | A1 * | 12/2005 | Fujii et al. .................... 252/500 |
| 2006/0070493 | A1 * | 4/2006 | Hirakoso et al. ............... 75/255 |

FOREIGN PATENT DOCUMENTS

| | | |
|---|---|---|
| EP | 0 895 252 A1 | 2/1999 |
| EP | 1 050 888 A1 | 11/2000 |
| EP | 1 340 568 A1 | 9/2003 |
| EP | 1 640 338 A1 | 3/2006 |
| GB | 2 053 058 A | 2/1981 |
| JP | 5-156303 | 6/1993 |
| JP | 6-325617 | 11/1994 |
| JP | 06-325617 * | 11/1994 |
| JP | 6-336562 | 12/1994 |
| JP | 2002-121606 | 4/2002 |
| JP | 2002-126869 | 5/2002 |
| JP | 2002-324966 | 11/2002 |
| JP | 2002-334618 | 11/2002 |
| JP | 2004-256757 | 9/2004 |
| JP | 2004-273205 | 9/2004 |
| WO | WO 00/47660 | 8/2000 |
| WO | WO 00/55915 | 9/2000 |
| WO | WO 02/30600 A1 | 4/2002 |
| WO | WO 02/42522 A2 | 5/2002 |
| WO | WO 03/103352 A1 | 12/2003 |
| WO | WO 2004/110925 * | 12/2004 |
| WO | WO 2004/110925 A1 | 12/2004 |
| WO | WO 2005/049745 A1 | 6/2005 |
| WO | WO 2005/097924 A1 | 10/2005 |
| WO | WO 2006/038011 A2 | 4/2006 |

OTHER PUBLICATIONS

Machine translation of JP 06-325617.*
K. Abe, et al., "Anti-Reflective Coatings for CRTS by Sol-Gel Process", Journal of Sol-Gel Science and Technology, vol. 22, 2001, pp. 151-166.

* cited by examiner

*Primary Examiner* — Vasu Jagannathan
*Assistant Examiner* — Doris L Lee
(74) *Attorney, Agent, or Firm* — Oblon, Spivak, McClelland, Maier & Neustadt, L.L.P.

(57) ABSTRACT

To provide an ink composition capable of forming a metallic material which is excellent in adhesion to a substrate and free from ion migration. An ink composition having fine metallic copper particles and/or fine copper hydride particles, and fine silver oxide particles or fine metallic silver particles, dispersed in a water-insoluble organic liquid, which composition has a solid content concentration of from 10 to 80 mass % and contains from 5 to 90 parts by mass of the fine metallic copper particles and/or fine copper hydride particles, and from 10 to 95 parts by mass of the fine silver oxide particles or fine metallic silver particles, per 100 parts by mass of the total solid content in the ink composition.

17 Claims, No Drawings

INK COMPOSITION AND METALLIC MATERIAL

TECHNICAL FIELD

The present invention relates to an ink composition and a metallic material.

BACKGROUND ART

In recent years, various methods have been studied to form an electric conductor by forming a pattern employing an ink comprising a dispersion having fine particles of a metal such as copper or silver dispersed in a liquid, followed by a heat treatment so that the metal fine particles are mutually sintered. Such methods may, for example, be a method of carrying out formation, repair or the like of a circuit pattern such as printed wiring, interlaminar wiring in a semiconductor package, or connection of a printed wiring board with an electronic component, by means of an ink jet printing method (Patent Document 1), a method of joining metals which replaces conventional soldering (Patent Document 2), and a method of forming an electrically conductive metal film capable of replacing a plated film in the field of electronic materials (Patent Document 3). Further, recently it has been disclosed that a metallic material can constantly be obtained by using a dispersion containing fine copper hydride particles which are hardly oxidized and excellent in storage stability (Patent Document 4).

The above methods for forming conductive metal films employ known nature called surface melting of metal particles (Non-Patent Document 1). It is generally known that the surface melting of metal particles takes place due to abnormal lattice vibration of atoms at the surface of the particles, and that the smaller the particle diameter and the higher the proportion of surface atoms, the more the surface melting temperature decreases. For example, in a case of copper, it is known that bulk copper has a melting point of 1,083° C., whereas fine particles having diameters of about 10 nm undergo the surface melting at a temperature of about 150° C. Since the surface melting depends on the particle diameter of the metal particles, it takes place even in an association state so long as individual fine metal particles have a predetermined particle diameter, unless particles are completely bound.

However, the coating film formed by any one of the above methods had no adequate adhesive strength when the substrate was highly flat such as a glass substrate. Further, the coating film was formed by utilizing the surface melting phenomenon, and in a case where fine metal particles having a large particle diameter at a level of μm size were used, the adhesive strength of the fine metal particles to one another was weak, and it was not possible to obtain a film having adequate strength. Further, in a case where a conductive metallic material was formed for wiring by using fine silver particles, there was a specific problem that ion migration took place, and an improvement to overcome such a problem has been desired.

Patent Document 1: JP-A-2002-324966
Patent Document 2: JP-A-2002-126869
Patent Document 3: JP-A-2002-334618
Patent Document 4: WO2004/110925
Non-Patent Document 1: "J. Sol-Gel Science and Technology" the Netherlands, Kluwer Academic Publishers, 2001, vol. 22, pages 151 to 166

DISCLOSURE OF THE INVENTION

Objects to be Accomplished by the Invention

It is an object of the present invention to provide an ink composition capable of forming a metallic material which is excellent in adhesion to a substrate and free from ion migration. Further, it is another object of the present invention to provide a metallic material which is excellent in adhesion to a substrate and free from ion migration.

Means to Accomplish the Objects

The present invention provides the following to accomplish the above objects.
(1) An ink composition having fine metallic copper particles and/or fine copper hydride particles, and fine silver oxide particles or fine metallic silver particles, dispersed in a water-insoluble organic liquid, which composition has a solid content concentration of from 10 to 80 mass % and contains from 5 to 90 parts by mass of the fine metallic copper particles and/or fine copper hydride particles, and from 10 to 95 parts by mass of the fine silver oxide particles or fine metallic silver particles, per 100 parts by mass of the total solid content in the ink composition.
(2) The ink composition according to the above (1), wherein the average particle diameter of the fine metallic copper particles and/or fine copper hydride particles, and the average particle diameter of the fine silver oxide particles or fine metallic silver particles, are at most 100 nm.
(3) The ink composition according to the above (1) or (2), wherein the fine copper hydride particles are ones produced by a wet reduction method.
(4) The ink composition according to any one of the above (1) to (3), wherein the fine metallic copper particles and/or fine copper hydride particles, and the fine silver oxide particles or fine metallic silver particles, are dispersed in the water-insoluble organic liquid in such a state that their surfaces are coated with a $C_{4-100}$ organic compound having at least one group selected from the group consisting of an amino group, an amide group, a mercapto group (—SH), a sulfide group (—S—), a hydroxyl group, a carboxyl group, a carbonyl group and an etheric oxy group.
(5) The ink composition according to the above (4), wherein the organic compound is octylamine, aminodecane, dodecylamine, tetradecylamine, stearylamine, oleylamine, benzylamine, dimethyldodecylamine or dimethyltetradecylamine.
(6) A metallic material obtained by applying the ink composition as defined in any one of the above (1) to (5) to a substrate having a centerline average roughness of at most 200 nm as defined by JIS B0601, followed by baking in a non-oxidizing atmosphere.
(7) The metallic material according to the above (6), wherein the substrate is made of glass, ceramic or metal.
(8) The metallic material according to the above (6) or (7), which has a volume resistivity of at most 100 μΩcm.

Effects of the Invention

By using the ink composition of the present invention, it is possible to obtain a metallic material which is excellent in adhesion to a substrate and free from ion migration.

BEST MODE FOR CARRYING OUT THE INVENTION

The ink composition of the present invention is one having the present fine copper particles and the present fine silver particles dispersed in a water-insoluble organic liquid. The ink composition of the present invention comprises from 5 to 90 parts by mass of the present fine copper particles and from 10 to 95 parts by mass of the present fine silver particles, per 100 parts by mass of the total solid content. It is thereby possible that when the ink composition of the present invention is applied to a substrate and baked to form a metallic material as a conductive film, it is possible to obtain one having high adhesion to the substrate and further being free from ion migration. The reason for the improvement of the adhesion is not clearly understood, but it is considered that as compared with a case where the present fine copper particles or the present fine silver particles are used alone, fusion of fine particles to one another is accelerated, whereby particles tend to closely adhere to one another, and the adhesion between the obtainable conductive film and the substrate will be improved. Further, the reason as to why the obtained conductive film is free from ion migration, is considered to be such that copper hardly susceptible to ion migration is segregated around silver which is otherwise susceptible to ion migration.

If the fine copper particles are less than 5 parts by mass per 100 parts by mass of the total solid content, no improvement in the property by the addition of the present fine copper particles will be obtained, whereby no effect to suppress ion migration will be observed, such being undesirable. On the other hand, if they exceed 90 mass %, the content of the present fine silver particles tend to be small, whereby fusion tends to hardly take place, and the fusion with the present fine copper particles tends to be inadequate, such being undesirable. The ink composition of the present invention preferably comprises from 20 to 80 parts by mass of the present fine copper particles and from 20 to 80 parts by mass of the present fine silver particles, per 100 parts by mass of the total solid content.

Further, the solid content concentration of the ink composition of the present invention is from 5 to 80 mass %. If the solid content concentration of the ink composition is less than 5 mass %, it tends to be difficult to obtain an adequate thickness of the deposited cured product of the ink composition after baking, and the electrical conductivity of the obtained metallic material tends to be low, such being undesirable. On the other hand, if the solid content concentration exceeds 80 mass %, the ink characteristics such as the viscosity, surface tension, etc. of the ink composition tend to deteriorate, whereby it tends to be difficult to use it as an ink, such being undesirable. To the ink composition, additives, organic binders, etc. may be added, as the case requires, depending upon the particular applications. The ink composition particularly preferably has a solid content concentration of from 10 to 70 masse.

The present fine copper particles are fine metallic copper particles and/or fine copper hydride particles. The fine metallic copper particles may be ones heretofore known, and a commercial product may be used as the case requires. Whereas, the fine copper hydride particles are present in a state where copper atoms and hydrogen atoms are bonded. Therefore, the fine copper hydride particles are stable and hardly oxidized in the atmospheric air as compared with the fine metallic copper particles and thus excellent in storage stability, such being desirable. Further, the fine copper hydride particles have a characteristic such that they decompose at a temperature of from 60 to 100° C. to form metallic copper. Therefore, when an ink composition containing the present fine copper particles is applied to a substrate and baked, as is different from fine metallic copper particles, it is less likely that an oxide coating film will be formed on the surface of the fine particles. Accordingly, by the nature of the surface fusion phenomenon, the fine metal particles will be readily melted and bonded to one another to form a metallic material, such being desirable.

As the present fine copper particles, such fine metallic copper particles or fine copper hydride particles may be used alone. Otherwise, they may be used as mixed, as the case requires. In a case where the fine metallic copper particles and the fine copper hydride particles are to be used as mixed, it is preferred to mix the fine metallic copper particles in a proportion of from 20 to 50 parts by mass per 100 parts by mass of the fine copper hydride particles.

In the present invention, the fine copper hydride particles are preferably produced by a wet reduction method. A water-soluble copper compound as a raw material is dissolved in water to prepare an aqueous solution containing copper ions, and an acid is added to adjust the pH to be at most 3. Then, a $C_{4-10}$ organic compound (hereinafter referred to as the present protecting agent) having at least one group selected from the group consisting of an amino group, an amido group, a mercapto group (—SH), a sulfide group (—S—), a hydroxyl group, a carboxyl group, a carbonyl group and an etheric oxy group, and a water-insoluble organic liquid are then added. Thereafter, with stirring, a reducing agent is added to reduce copper ions, whereby fine copper hydride particles can be formed. It is considered that the obtained fine copper hydride particles will have their surface immediately covered by the present protecting agent which is dissolved in the oil component and will be taken into and stabilized in the oil layer. By recovering such an oil layer, it is possible to obtain a dispersion having the fine copper hydride particles dispersed in the water-insoluble organic liquid. Such a dispersion can be used as an ink composition to form a metallic material, as mixed with the present fine silver particles and further with other additives, as the case requires. The obtained dispersion or ink composition is capable of preventing oxidation of copper during the storage in the atmosphere which used to be problematic, since the fine copper hydride particles are dispersed in the water-insoluble organic liquid, such being desirable.

The above water-soluble copper compound may, for example, be copper sulfate, copper nitrate, copper acetate, copper chloride, copper bromide or copper iodide. The water-soluble copper compound is preferably made into an aqueous solution having a concentration of from 0.1 to 30 mass %. If the concentration of the aqueous solution of the water-soluble copper compound is less than 0.1 mass %, a large amount of water is required, and the production efficiency for the copper hydride particles tends to be poor, such being undesirable. On the other hand, if the concentration exceeds 30 mass %, the agglomeration stability of the obtained fine copper hydride particles tends to be low, such being undesirable.

As the acid to adjust the above pH, citric acid, maleic acid, malonic acid, acetic acid, propionic acid, sulfuric acid, nitric acid or hydrochloric acid is, for example, preferred. Among them, citric acid, maleic acid or malonic acid is particularly preferred, since it forms a stable complex with copper ions thereby to prevent adsorption of hydration water to copper ions.

When the pH is at most 3, by the action of a reducing agent to be subsequently added, copper ions in the aqueous solution will readily be obtainable in the form of fine copper hydride particles, such being desirable. If the pH exceeds 3, fine copper hydride particles tend to be hardly obtainable, and copper ions tend to be fine metallic copper particles, such being undesirable. The pH is particularly preferably from 1 to 2, whereby fine copper hydride particles can be formed in a short time.

The above reducing agent is preferably added in an amount of from 1.5 to 10 times by equivalent to the copper ions. If the amount of the reducing agent is less than 1.5 times by equivalent to copper ions, the reducing performance tends to be inadequate, such being undesirable. On the other hand, if it exceeds ten times by equivalent, the agglomeration stability of the obtainable fine copper hydride particles tends to be low, such being undesirable.

As such a reducing agent, a metal hydride is preferred, since its reducing action is large, and for example, aluminum lithium hydride, lithium borohydride, sodium borohydride, lithium hydride, potassium hydride or calcium hydride may be mentioned. Among them, aluminum lithium hydride, lithium borohydride or sodium borohydride is particularly preferred.

The above-mentioned protecting agent is preferably one having at least one group selected from the group consisting of an amino group, an amido group, a mercapto group (—SH) and a sulfide group (—S—) in its molecule. Such a group may be present at any position in the molecule, but particularly preferably present at a terminal. Further, the present protecting agent is preferably one having from 4 to 20 carbon atoms and may be a saturated or unsaturated one, and particularly preferred is a straight chained one. Such present protecting agent is preferred, since it is thermally stable, has a proper vapor pressure and has a good handling efficiency. The carbon number of the present protecting agent is particularly preferably from 8 to 18.

Further, the present protecting agent is required not to detach from the fine particles within a temperature range of usual storage environment and required to readily detach from the surface of the fine particles when baking is carried out. Therefore, the boiling point of the present protecting agent is preferably from 60 to 300° C., particularly preferably from 100 to 250° C.

As an organic compound containing an amino group or an amido group, as the present protecting agent, octylamine, aminodecane, dodecylamine, tetradecylamine, stearylamine, oleylamine, benzylamine, dimethyldodecylamine, dimethyltetradecylamine, stearylamide or oleylamide may, for example, be mentioned. Further, as an organic compound containing a mercapto group or a sulfide group, as the present protecting agent, decanethiol, dodecanethiol, trimethylbenzylmercaptane, butylbenzylmercaptane or hexylsulfide may, for example, be mentioned.

Particularly, as the present protecting agent, the above-mentioned organic compound containing an amino group is particularly preferred from such a viewpoint that the dispersion stability and the electrical conductivity of the conductive film after baking, are excellent. The reason is such that adsorption of amino groups on the surface of the fine particles is strong to provide excellent agglomeration preventing performance, and it is free from forming a non-conductive metal compound such as a sulfide after baking like a mercapto group.

The present protecting agent is suitably selected for use depending upon the particular application of the ink composition to be used. However, it is preferably incorporated in an amount of from 5 to 300 parts by mass per 100 parts by mass of the fine particles. If it is too much, it will remain in the metal film even after the baking and is likely to impair the electrical conductivity of the conductive metal film. On the other hand, if it is too little, the dispersion stability of the dispersion of fine particles tends to be inadequate, which is likely to impair the uniformity of the metal film formed after the baking.

The above water-insoluble organic liquid (hereinafter referred to simply as the organic liquid) has a function as a dispersing medium in the dispersion. The organic liquid is preferably one having a thermal stability so that even at the time of forming a metallic material, it relatively quickly evaporates under heating after the coating and it undergoes no thermal decomposition. As such an organic liquid, it is possible to employ at least one selected from the group consisting of hexane, heptane, octane, decane, dodecane, tetradecane, decene, dodecene, tetradecene, cyclohexane, cyclooctane, dipentene, α-terpene, β-terpene, terpineol, xylene, toluene, ethyl benzene, mesitylene, octanol, nonanol, and decanol. The organic liquid is suitably selected depending upon the particular application of the dispersion to be used, and it is preferably added in an amount of from 20 to 270 parts by mass per 100 parts by mass of the fine particles. In the present invention, the water-insoluble organic liquid is meant for one having a solubility of at most 0.1 g in 100 g of water.

The above-mentioned present fine silver particles are fine silver oxide particles or fine metallic silver particles. For each of the fine silver oxide particles and the fine metallic silver particles, commercially available ones may be used, as the case requires. The present fine silver particles are particularly preferably fine metallic silver particles, since fine particles of at most 100 nm can readily be obtainable. The metallic silver particles are preferably ones obtainable by a wet preparation method from the viewpoint of the production cost.

The present fine copper particles and the present fine silver particles (hereinafter referred to as the present fine particles) preferably have an average particle diameter of at most 5 μm, whereby a proper adhesive strength can be obtained. Further, the present fine particles particularly preferably have an average particle diameter of at most 100 nm, whereby it will be possible to form fine wirings, and the surface melting temperature tends to be low so that the surface fusion tends to readily take place to form a dense metallic material, whereby the electrical conductivity will be improved. The present fine particles particularly preferably have an average particle diameter of at most 50 nm.

In a case where the average particle diameter of the present fine particles is of a μm size, it is preferably measured by a conventional method such as a method for a laser beam scattering system. Further, in a case where the average particle diameter of the present fine particles is of a nm size, it is preferably measured by means of a transmission electron microscope (TEM) or a scanning electron microscope (SEM). In the present invention, in the case of the nm size, the particle diameter of the fine particles is meant for the particle diameter for a primary particle observed. Further, the average particle diameter is defined to be an average value of 100 fine particles randomly selected from the observed fine particles.

The ink composition of the present invention is preferably an ink composition having the present fine particles dispersed in the water-insoluble organic liquid. Namely, in a case where the present fine particles are not dispersed in a dispersion, the water-insoluble organic liquid is added and mixed thereto, or even in the case of a dispersion having the present fine particles dispersed in a water-insoluble organic liquid, further mixing may be carried out. Further, it is preferred that to the ink composition of the present invention, the present protecting agent or other additives are added as the case requires. Further, the present fine particles preferably have their surface coated with the present protecting agent, whereby the present fine particles in the ink composition will be further hardly oxidized, and there will be an effect to prevent agglomeration of the present particles one another, whereby it will be possible to form a dense conductive film.

In the present invention, the above ink composition is applied to a substrate having a center line average roughness of at most 200 nm as defined by JIS B0601, followed by baking in a non-oxidizing atmosphere, to obtain a metallic material as a conductive film having good adhesion.

The substrate of the present invention preferably has a center line average roughness of at most 200 nm as defined by JIS B0601, since it is thereby possible to obtain a conductive film excellent in adhesion and electrical conductivity. If the center line average roughness exceeds 200 nm, the thickness of the coated film tends to be non-uniform due to irregularities of the substrate, whereby there will be portions where the electrical conductivity locally deteriorates, such being undesirable. As the substrate, a known substrate may be used as the case requires, and glass, ceramics, plastics or metals may, for example, be mentioned. In a case where the substrate is a plastic, specifically, it is preferably a highly heat resistant engineering plastic such as polyimide, polysulfone or polyphenylsulfide. An inorganic substrate of e.g. glass, ceramic or metal is particularly preferred since it is excellent in adhesion.

Various conventional methods may be used as methods for applying the ink to form a metallic material such as a conductive film of the present invention. The coating method may, for example, be inkjet printing, screen printing, or a method by means of a roll coater, an air knife coater, a blade coater, a bar coater, a gravure coater, a die coater, a spray coater or a slide coater. Among them, an inkjet printing method is particularly preferred. In the case of printing by means of an inkjet printer, it is preferred that the ink ejection hole is about 20 μm, and the ink droplet diameter changes during its flying after the ejection and will spread on the object to be covered upon reaching the object to be covered. The diameter of the ink immediately after the ejection is about the diameter of the ejection hole, but after reaching the object to be covered, the diameter of the deposited ink will spread to a level of from 5 to 100 μm. Accordingly, the fine particles in the ink may be agglomerated so long as such agglomeration presents no adverse effect to e.g. the ink viscosity, and the agglomerated diameter in such a case is preferably at most 2 μm.

In the present invention, as the method for baking to obtain a metallic material after application of the ink composition, a method such as hot air heating or thermal radiation may be employed. The heating temperature and treating time are suitably determined based on the properties actually desired. Further, with respect to the atmosphere at the time of the baking, it is preferred to carry out the baking in a non-oxidizing gas atmosphere such as nitrogen or argon. In such a non-oxidizing atmosphere, the oxygen concentration is preferably at most 1,000 ppm, whereby the present fine particles will not be oxidized, and a metallic material excellent in electrical conductivity will be obtained, such being desirable.

The metallic material of the present invention preferably has a volume resistivity of at most 100 μΩcm. If the volume resistivity exceeds 100 μΩcm, it tends to be difficult to use such a material as an electrical conductor for electronic components, such being undesirable.

EXAMPLES

Now, Examples of the present invention (Examples 2 to 7, 10 to 15, 18 to 23, 26 to 31, 34 to 39 and 42 to 47) and Comparative Examples (Examples 1, 8, 9, 16, 17, 24, 25, 32, 33, 40, 41, and 48) will be shown. Here, the average particle diameter of fine particles obtained in such Examples was measured by a transmission electron microscope (Model: H-9000, manufactured by Hitachi, Ltd.) or a scanning electron microscope (Model: S-900, manufactured by Hitachi, Ltd.). X-ray diffraction was measured by RINT2500, manufactured by Rigaku Corporation. Further, evaluation of the adhesion of the obtained coating film was carried out by a cross-cut tape peeling test in accordance with JIS K5400.

Example 1 to 8

Preparation of Dispersion Containing Fine Copper Hydride Particles

In a glass container, 5 g of copper (II) chloride dianhydride was dissolved in 150 g of distilled water to obtain an aqueous solution containing copper ions. The pH of the obtained aqueous solution was 3.4. 90 g of a 40% citric acid aqueous solution (concentration by mass, the same applies hereinafter) was added thereto, followed by stirring for a while, whereupon the pH of the obtained aqueous solution became 1.7. To this aqueous solution, a solution obtained by mixing 5 g of dodecyl amine and 10 g of cyclohexane was added and with vigorous stirring, 150 g of a 3% sodium borohydride aqueous solution was slowly dropwise added. After completion of the dropwise addition, the mixture was left to stand still for one hour to let it separate into an aqueous layer and an oil layer. Then, only the oil layer was recovered to obtain a black colored dispersion having fine particles dispersed. The fine particles in this dispersion were recovered and identified by X-ray diffraction, whereby formation of fine copper hydride particles was confirmed. Further, the average particle diameter of the fine particles dispersed in this dispersion was measured and found to be about 10 nm.

Preparation of Dispersion Containing Fine Silver Particles

In a glass container, 14 g of sodium citrate dihydrate and iron (II) sulfate heptahydrate were dissolved in 60 g of distilled water to obtain an aqueous solution. To this aqueous solution, 25 g of a 10% silver nitrate aqueous solution was added. Thereafter, formed precipitates were centrifugally separated and dispersed in 1,000 g of distilled water to obtain a dispersion. Then, 0.04 g of dodecylamine was dissolved in 2.5 g of cyclohexane, and added to 25 g of the above dispersion, followed by stirring for one hour. With stirring, 2.5 g of sodium chloride was added, and stirring was continued for one hour, whereupon the mixture was left to stand still for one hour to let it separate into a water layer and an oil layer. Then, only the oil layer was recovered to obtain a black-colored dispersion having fine particles dispersed. The fine particles in this dispersion were recovered and identified by X-ray diffraction, whereby formation of fine metallic silver particles was confirmed. Further, the average particle diameter of fine particles dispersed in this dispersion was measured and found to be about 20 nm.

The dispersion containing fine copper hydride particles and the dispersion containing fine metallic silver particles, prepared by the above-described methods, were mixed to be in the blend ratio as shown in Table 1, and the mixture was applied to have a size of 3 cm×3 cm on a glass substrate (center line average roughness: 2 nm) by means of a bar coater. Thereafter, baking was carried out at 350° C. for one hour in a nitrogen atmosphere (oxygen concentration: 40 ppm) to obtain a coating film of a metallic material. With respect to the obtained coating film, evaluation of the adhesion and volume resistivity was carried out. The evaluation results are shown in Table 1.

TABLE 1

|  | Fine copper hydride particles (parts by mass) | Fine metallic silver particles (parts by mass) | Adhesion | Volume resistivity (μΩ cm) |
| --- | --- | --- | --- | --- |
| Ex. 1 | 100 | 0 | 0/100 | 4 |
| Ex. 2 | 90 | 10 | 10/100 | 3 |
| Ex. 3 | 80 | 20 | 45/100 | 4 |
| Ex. 4 | 50 | 50 | 60/100 | 4 |
| Ex. 5 | 20 | 80 | 70/100 | 5 |
| Ex. 6 | 10 | 90 | 40/100 | 4 |
| Ex. 7 | 5 | 95 | 30/100 | 3 |
| Ex. 8 | 0 | 100 | 0/100 | 4 |

Examples 9 to 16

50 g of xylene having 0.5 g of dodecylamine dissolved therein, was added to 10 g of commercially available fine metallic copper particles (primary particle size: 50 nm, manufactured by Ishihara Sangyo Kaisha, Ltd.), followed by dispersing in a ball mill for 12 hours to obtain a dispersion containing fine metallic copper particles. In the same manner as in Example 1 except that this dispersion was used instead of the dispersion containing fine copper hydride particles, an ink composition was prepared, applied and baked to obtain a coating film of a metallic material, and then, the evaluation was carried out. The evaluation results are shown in Table 2.

TABLE 2

|  | Fine metallic copper particles (parts by mass) | Fine metallic silver particles (parts by mass) | Adhesion | Volume resistivity (μΩ cm) |
| --- | --- | --- | --- | --- |
| Ex. 9 | 100 | 0 | 0/100 | 50 |
| Ex. 10 | 90 | 10 | 5/100 | 35 |
| Ex. 11 | 80 | 20 | 30/100 | 40 |
| Ex. 12 | 50 | 50 | 30/100 | 25 |
| Ex. 13 | 20 | 80 | 40/100 | 20 |
| Ex. 14 | 10 | 90 | 20/100 | 30 |
| Ex. 15 | 5 | 95 | 20/100 | 20 |
| Ex. 16 | 0 | 100 | 0/100 | 20 |

Examples 17 to 24

50 g of xylene having 0.5 g of dodecylamine dissolved therein, was added to 10 g of commercially available fine metallic copper particles (tradename: CUE08PB, manufactured by Kojundo Chemical Lab. Co., Ltd., average particle diameter: 3 μm), followed by dispersing in a ball mill for 12 hours to obtain a dispersion containing fine metallic copper particles. In the same manner as in Example 1, except that this dispersion was used instead of the dispersion containing fine copper hydride particles, an ink composition was prepared, applied and baked to obtain a coating film of a metallic material, and then, the evaluation was carried out. The evaluation results are shown in Table 3.

TABLE 3

|  | Fine metallic copper particles (parts by mass) | Fine metallic silver particles (parts by mass) | Adhesion | Volume resistivity (μΩ cm) |
| --- | --- | --- | --- | --- |
| Ex. 17 | 100 | 0 | 0/100 | 50 |
| Ex. 18 | 90 | 10 | 5/100 | 35 |
| Ex. 19 | 80 | 20 | 25/100 | 40 |
| Ex. 20 | 50 | 50 | 25/100 | 25 |
| Ex. 21 | 20 | 80 | 35/100 | 20 |
| Ex. 22 | 10 | 90 | 30/100 | 25 |
| Ex. 23 | 5 | 95 | 10/100 | 30 |
| Ex. 24 | 0 | 100 | 0/100 | 20 |

Examples 25 to 32

In the same manner as in Example 1 except that a dispersion containing commercially available fine metallic silver particles (tradename: DOTITE FA-333, manufactured by Fujikurakasei Co., Ltd., average particle diameter: 3 μm) was used instead of the dispersion of fine metallic silver particles, an ink composition was prepared, applied and baked to obtain a coating film of a metallic material, and then, the evaluation was carried out. The evaluation results are shown in Table 4.

TABLE 4

|  | Fine copper hydride particles (parts by mass) | Fine metallic silver particles (parts by mass) | Adhesion | Volume resistivity (μΩ cm) |
| --- | --- | --- | --- | --- |
| Ex. 25 | 100 | 0 | 0/100 | 50 |
| Ex. 26 | 90 | 10 | 5/100 | 35 |
| Ex. 27 | 80 | 20 | 20/100 | 40 |
| Ex. 28 | 50 | 50 | 25/100 | 25 |
| Ex. 29 | 20 | 80 | 35/100 | 20 |
| Ex. 30 | 10 | 90 | 30/100 | 25 |
| Ex. 31 | 5 | 95 | 10/100 | 30 |
| Ex. 32 | 0 | 100 | 0/100 | 20 |

Examples 33 to 40

50 g of xylene having 0.5 g of dodecylamine dissolved therein, was added to 10 g of commercially available fine metallic copper particles (tradename: MD200, manufactured by Ishihara Sangyo Kaisha, Ltd., average particle diameter: 3 μm), followed by dispersing in a ball mill for 12 hours to obtain a dispersion containing fine metallic copper particles. In the same manner as in Example 1 except that this dispersion and a dispersion containing commercially available fine metallic silver particles (tradename: DOTITE FA-333, manufactured by Fujikurakasei Co., Ltd., average particle diameter: 3 μm) were used, an ink composition was prepared, applied and baked to obtain a coating film of a metallic material, and then, the evaluation was carried out. The evaluation results are shown in Table 5.

TABLE 5

|  | Fine metallic copper particles (parts by mass) | Fine metallic silver particles (parts by mass) | Adhesion | Volume resistivity (μΩ cm) |
|---|---|---|---|---|
| Ex. 33 | 100 | 0 | 0/100 | 80 |
| Ex. 34 | 90 | 10 | 5/100 | 85 |
| Ex. 35 | 80 | 20 | 15/100 | 60 |
| Ex. 36 | 50 | 50 | 25/100 | 65 |
| Ex. 37 | 20 | 80 | 20/100 | 50 |
| Ex. 38 | 10 | 90 | 10/100 | 55 |
| Ex. 39 | 5 | 95 | 10/100 | 45 |
| Ex. 40 | 0 | 100 | 0/100 | 40 |

Examples 41 to 48

By means of a dispenser device (tradename: SHOTMASTER 300, manufactured by Musashi Engineering Inc.), the ink composition obtained in Example 1 was applied on a resin substrate (tradename: HL832NX, manufactured by Mitsubishi Gas Chemical Company, Inc., center line average roughness: 150 nm) in a pattern to meet the requirements for the following evaluation tests, to form a pattern of a metallic material. Using the formed pattern of the metallic material, the following evaluation tests were carried out respectively. The results are shown in Table 6.

Ion Migration Test

In accordance with JIS Z3197, a pattern of ten linear wirings of 200 μm in width and 2 cm in length spaced every 200 μm was formed in a comb formation, followed by baking in a nitrogen atmosphere (oxygen concentration: 40 ppm) at 200° C. for one hour to form a wiring pattern of a metallic material. The formed wiring pattern was placed in a constant temperature and humidity tank, and a direct current voltage of 100 V was applied between the wirings under conditions of 85° C. and a relative humidity of 95 RH %, whereby the resistance was measured, and the time from the initiation of the test to the dielectric breakdown was measured. The insulation resistance at the initiation was at least $10^{15}\Omega$, and evaluation was carried out on such a basis that the dielectric breakdown occurred when the insulation resistance became lower than $10^{10}\Omega$.

Oxidation Resistance Test

A linear wiring pattern of 200 μm in width and 30 mm in length was formed, followed by baking in a nitrogen atmosphere (oxygen concentration: 1,000 ppm) at 200° C. for one hour to form a wiring pattern of a metallic material. The resistance of the formed wiring pattern was measured, and the evaluation was carried out.

TABLE 6

|  | Fine copper hydride particles (parts by mass) | Fine metallic silver particles (parts by mass) | Migration resistance (hr) | Volume resistivity (μΩ cm) |
|---|---|---|---|---|
| Ex. 41 | 100 | 0 | More than 700 hours | 250 |
| Ex. 42 | 90 | 10 | More than 700 hours | 60 |
| Ex. 43 | 80 | 20 | More than 700 hours | 20 |
| Ex. 44 | 50 | 50 | More than 700 hours | 16 |
| Ex. 45 | 20 | 80 | More than 700 hours | 14 |
| Ex. 46 | 10 | 90 | 600 hours | 12 |
| Ex. 47 | 5 | 95 | 600 hours | 10 |
| Ex. 48 | 0 | 100 | 200 hours | 8 |

Industrial Applicability

The ink composition of the present invention is most suitable for use in an application to form or repair printed wirings, etc., to form interlaminar wirings in a semiconductor package or to bond a printed circuit board and an electric component.

The entire disclosure of Japanese Patent Application No. 2005-114700 filed on Apr. 12, 2005 including specification, claims and summary is incorporated herein by reference in its entirety.

What is claimed is:

1. An ink composition having fine metallic copper particles and/or fine copper hydride particles, and fine silver oxide particles or fine metallic silver particles, dispersed in a water-insoluble organic liquid, which composition has a solid content concentration of from 10 to 80 mass % and comprises from 5 to 90 parts by mass of the fine metallic copper particles and/or fine copper hydride particles, and from 10 to 95 parts by mass of the fine silver oxide particles or fine metallic silver particles, per 100 parts by mass of the total solid content in the ink composition, wherein the average particle diameter of the fine metallic copper particles and/or fine copper hydride particles, and the average particle diameter of the fine silver oxide particles or fine metallic silver particles, are at most 100 nm.

2. The ink composition according to claim 1, wherein fine copper hydride particles are present and the fine copper hydride particles are ones produced by a wet reduction method.

3. The ink composition according to claim 1, wherein the fine metallic copper particles and/or fine copper hydride particles, and the fine silver oxide particles or fine metallic silver particles, are dispersed in the water-insoluble organic liquid in such a state that their surfaces are coated with a $C_{4-100}$ organic compound having at least one group selected from the group consisting of an amino group, an amide group, a mercapto group (—SH), a sulfide group (—S—), a hydroxyl group, a carboxyl group, a carbonyl group and an etheric oxy group.

4. A metallic material obtained by applying the ink composition as defined in claim 1 to a substrate having a centerline average roughness of at most 200 nm as defined by JIS B0601, followed by baking in a non-oxidizing atmosphere.

5. The ink composition according to claim 1, wherein fine metallic copper particles are present.

6. The ink composition according to claim 1, wherein fine copper hydride particles are present.

7. The ink composition according to claim 1, wherein fine metallic silver oxide particles are present.

8. The ink composition according to claim 1, wherein fine metallic silver particles are present.

9. The ink composition according to claim 1, wherein the fine metallic copper particles and/or fine copper hydride particles are present in an amount of from 20 to 80 parts by mass, and the fine silver oxide particles or fine metallic silver particles are present in an amount of 20 to 80 parts by mass, per 100 parts by mass of the total solid content.

10. The ink composition according to claim 1, wherein the solid content concentration is from 10 to 70 mass %.

11. The ink composition according to claim 1, wherein the fine metallic copper particles and the fine copper hydride particles are both present.

12. The ink composition according to claim 1, wherein the average particle diameter of all the fine particles is at most 50 nm.

13. The ink composition according to claim 3, wherein the organic compound is octylamine, aminodecane, dodecylamine, tetradecylamine, stearylamine, oleylamine, benzylamine, dimethyldodecylamine or dimethyltetradecylamine.

14. The ink composition according to claim 3, wherein the organic compound is present in an amount of from 5 to 300 parts by mass per 100 parts by mass of the fine particles.

15. The metallic material according to claim 4, wherein the substrate is made of glass, ceramic or metal.

16. The metallic material according to claim 4, which has a volume resistivity of at most 100 $\mu\Omega$cm.

17. The ink composition according to claim 11, wherein the fine metallic copper particles are present in an amount of from 20 to 50 parts by mass per 100 parts by mass of the fine copper hydride particles.

* * * * *